United States Patent [19]

Hanamura et al.

[11] Patent Number: 5,088,065
[45] Date of Patent: * Feb. 11, 1992

[54] STATIC TYPE SEMICONDUCTOR MEMORY

[75] Inventors: Shoji Hanamura, Kokubunji; Masaaki Kubotera, Tokyo; Katsuro Sasaki, Tokyo; Takao Oono, Tokyo; Kiyotsugu Ueda, Tokyo, all of Japan

[73] Assignee: Hitachi, Ltd., Tokyo, Japan

[*] Notice: The portion of the term of this patent subsequent to Jan. 2, 2007 has been disclaimed.

[21] Appl. No.: 593,584

[22] Filed: Oct. 5, 1990

Related U.S. Application Data

[63] Continuation of Ser. No. 352,740, May 16, 1989, abandoned, which is a continuation of Ser. No. 215,824, Jul. 6, 1988, Pat. No. 4,891,792.

[30] Foreign Application Priority Data

Sep. 4, 1987 [JP] Japan .................................. 62-220227

[51] Int. Cl.⁵ .............................................. G11C 7/06
[52] U.S. Cl. ............................ 365/208; 365/189.05; 365/189.07; 365/190; 365/202; 365/205; 365/230.01; 365/233
[58] Field of Search ................... 365/207, 208, 189.05, 365/189.07, 190, 202, 227, 233, 205, 233.5, 230.01

[56] References Cited

U.S. PATENT DOCUMENTS

| 4,777,625 | 10/1988 | Sakui et al. | 365/189.05 |
|---|---|---|---|
| 4,780,850 | 10/1988 | Miyamoto et al. | 365/208 |
| 4,791,616 | 12/1988 | Taguchi et al. | 365/208 |
| 4,980,863 | 12/1990 | Ogihara | 365/205 |

Primary Examiner—Joseph E. Clawson, Jr.
Attorney, Agent, or Firm—Kenyon & Kenyon

[57] ABSTRACT

Information read out from a memory cell of a static type semiconductor memory is subjected to multi-stage sense amplification in an initial stage sense amplifier, a post-stage sense amplifier and a main amplifier and then transmitted to the input of an output buffer circuit. Since an equalizing circuit is connected to the complementary inputs of each stage of the multi-stage sense amplifier, an inverse information read operation can be executed at high speed. Initially, the initial stage sense amplifier, the post-stage sense amplifier and the main amplifier are controlled to operate in high amplification gain conditions so as to execute high speed sense amplification and thereafter controlled to operate in such low power consumption conditions that the read-out information output obtained by the high speed sense amplification will not disappear.

4 Claims, 5 Drawing Sheets

STATIC TYPE SEMICONDUCTOR MEMORY

This application is a continuation of application Ser. No. 07/352,740, abandoned, filed 5/16/89 which is a continuation of Ser. No. 07/215,824 filed 7/6/88, now U.S. Pat. No. 4,891,792.

BACKGROUND OF THE INVENTION

The present invention relates to a static type semiconductor memory and, more particularly, to sense circuit technology which is suitable for achieving a high speed operation and a low power consumption.

The sense circuits of conventional static type semiconductor memories are discussed in ISSCC86, Digest of Technical Papers (1986), pp.208-209, and IEEE, Journal of Solid State Circuits, SC-21 (1986), pp.692-703.

The present inventors set the development target of our static type semiconductor memory to a large memory capacity, i.e., 1 megabits or more, a high speed, i.e., an access time of 40 nanoseconds or less, and a low power consumption, i.e., an operating power consumption of 0.5 watt or less.

In the above-mentioned prior art, no substantial consideration is given to achievement of a high speed operation and a low power consumption, which are part of our development target.

FIG. 3 shows a static type memory studied by the present inventors prior to the filing of this application. In the figure, the reference numeral 1 denotes a memory cell, 2 a word line, 3 a column switch for selectively connecting predetermined data line pair 4 to first data bus line pair 5, an initial stage sense amplifier 8, a post-stage sense amplifier 7, 5' second data bus line pair for transmitting a pair of the outputs of the postage sense amplifier 8 to a main amplifier 11, an output buffer 12, 18 a signal output terminal 18, a data latch circuit 20 incorporated in the output buffer 12, and an equalizing circuit 10.

In the memory shown in FIG. 3, the outputs of the sense amplifiers 7 and 8 are directly connected to the second data bus lines pair 5'. Therefore, the sense amplifier operation is enabled during only the initial period of the operation cycle, and the amplified signal must be latched in the latch circuit 20 within the output buffer 12. In this case, in order to avoid latching of error information attributable to offset of the amplifiers 7, 8 and 11, a sufficient time margin is needed for latching, which is unsuitable for achieving a high speed operation.

The studies conducted have also revealed that no consideration is given to equalization of complementary signals at the stages which are subsequent to the sense amplifier 7, but equalization of these complementary signals are successively effected as far as the output line pair of the main amplifier 11 on the basis of the equalization effected between the complementary input signal line pair of the initial stage sense amplifier 7 by the equalizing circuit 10. Therefore, a long time is required to complete the equalization necessary for the entire system, which is also unsuitable for achieving a high speed operation.

SUMMARY OF THE INVENTION

It is an object of the present invention to provide a static type semiconductor memory having a large memory capacity, high speed operation and low power consumption.

To this end, the present invention provides a static type semiconductor memory comprising: a plurality of memory arrays each of which includes a plurality of memory cells, a plurality of complementary data line pairs, a first complementary data bus line pair, first switching means connected between the plurality of complementary data line pair and the first complementary data bus line pair, and first amplifier means responding to complementary signals on the first complementary data bus line pair, each of the plurality of complementary data line pairs being connected to a selected group of the plurality of memory cells; a second complementary data bus line pair; second switching means connected between complementary outputs of the first amplifier means and the second complementary data bus lines pair; second amplifier means responding to complementary signals on the second complementary data bus line pair; third amplifier means for generating an output signal in response to complementary outputs of the second amplifier means; first equalizing means for minimizing level difference of complementary inputs of the first amplifier means in response to a first control signal; second equalizing means for minimizing a level difference of complementary inputs of the second amplifier means in response to a second control signal; and third equalizing means for minimizing a level difference of complementary inputs of the third amplifier means in response to a third control signal; wherein an operation of the first amplifier means is controlled by a fourth control signal, wherein an operation of the second amplifier means is controlled by a fifth control signal, wherein an address signal for accessing a selective one from among the plurality of memory cells is supplied to the static type semiconductor memory, wherein levels of the first, second and third control signals are set to such a value that level difference minimizing operations of the first, second and third equalizing means are executed in response to a change of level of the address signal, and thereafter levels of the first, second and third control signals are set to such a value that the level difference minimizing operations of the first, second and third equalizing means are dissolved, and wherein levels of the fourth and fifth control signals are set to such a value that the first and second amplifier means operate in high amplification gain conditions in response to the change of level of the address signal, and thereafter levels of the fourth and fifth control signals are set to such a value that the first and second amplifier means operate in low power consumption conditions.

A selective access operation for the memory cells is initiated in response to a change of level of the address signal. The selective access operation is executed through word line selection based on a row address and column selection based on a column address by decoding the address signal after the change of level. The column selection is executed by the first and second switching means.

During the initial period of the selective access operation, the level difference minimizing operations of the first, second and third equalizing means are executed. As is well known, digital information, i.e., "1" (high) of "0" (low), is read out from a selected memory cell, and the level of each of the complementary inputs of multi-stage sense amplifier means is determined on the basis of the read-out digital information. There are cases where the present read-out digital information is in inverse relation to digital information read out previous to it. In such cases, one and the other of each pair of complementary inputs of the multi-stage sense amplifier means change from the level "1" to the level "0" and from the level "0" to the level "1", respectively. Since each of the first, second and third equalizing means sets the one and the other of each pair of complementary inputs of the multi-stage sense amplifier means to an intermediate level between the levels "1" and "0", the above-described inverse information read operation can be executed at high speed.

In advance of the dissolution of the level difference minimizing operations of the first, second and third equalizing means, the multi-stage sense amplifier means has been controlled so as to operate in a high amplification gain condition. When the level difference minimizing operation is dissolved, the intermediate period of the selective access operation is initiated, and information read out from a memory cell selected after the dissolution of the level difference minimizing operation is amplified at high speed by the multi-stage sense amplifier means in the high amplification gain condition.

It is unfavorable from the viewpoint of power consumption to maintain the multi-stage sense amplifier means in the high amplification gain condition after the completion of the high speed amplification. To lower the power consumption, it is effective practice to suspend the operation of the multi-stage sense amplifier means after the completion of the high speed amplification. If the operation of the multi-stage sense amplifier means is suspended, however, the information read output after the completion of the high speed amplification undesirably disappears. Accordingly, during the final period of the selective access operation after the completion of the high speed amplification, the multi-stage sense amplifier means is controlled so as to operate in a low power consumption condition.

In addition, despite a large memory capacity, i.e., 1 megabits or more, it is possible to achieve a high speed operation since information read out from one selected memory cell is transmitted to the first complementary data bus lines pair in the array to which the selected memory cell belongs and the complementary signals on the first complementary data bus lines pair are amplified in the sense amplifier means and then transmitted to the second complementary data bus lines pair which are common to the whole of the semiconductor memory chip.

DESCRIPTION OF THE PREFERRED EMBODIMENTS

One embodiment of the present invention will be described hereinunder with reference to FIGS. 1 and 2.

Figure 1:
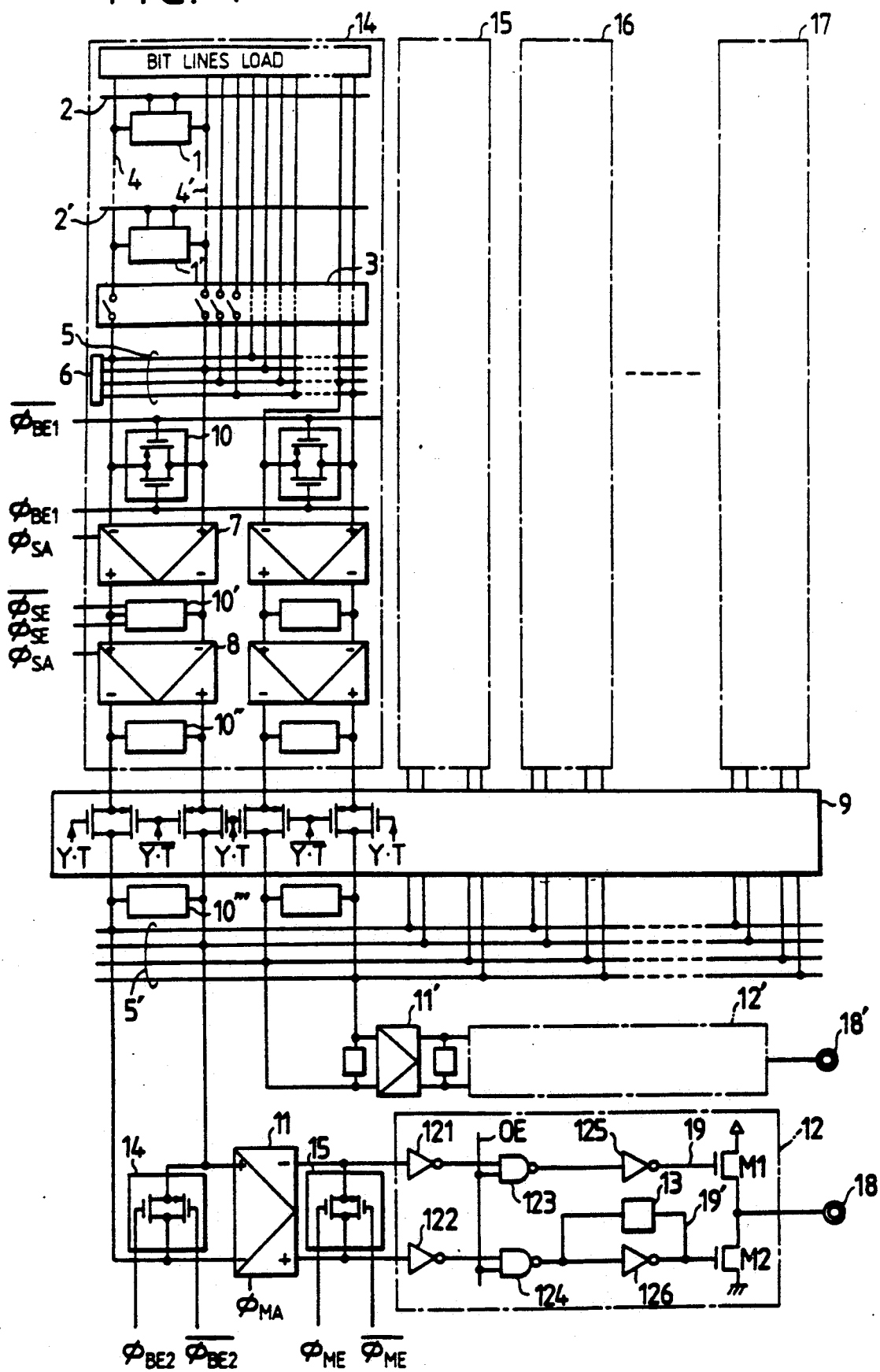
FIG. 1 is a block diagram of a static type semiconductor memory according to one embodiment of the present invention.
Figure 2:
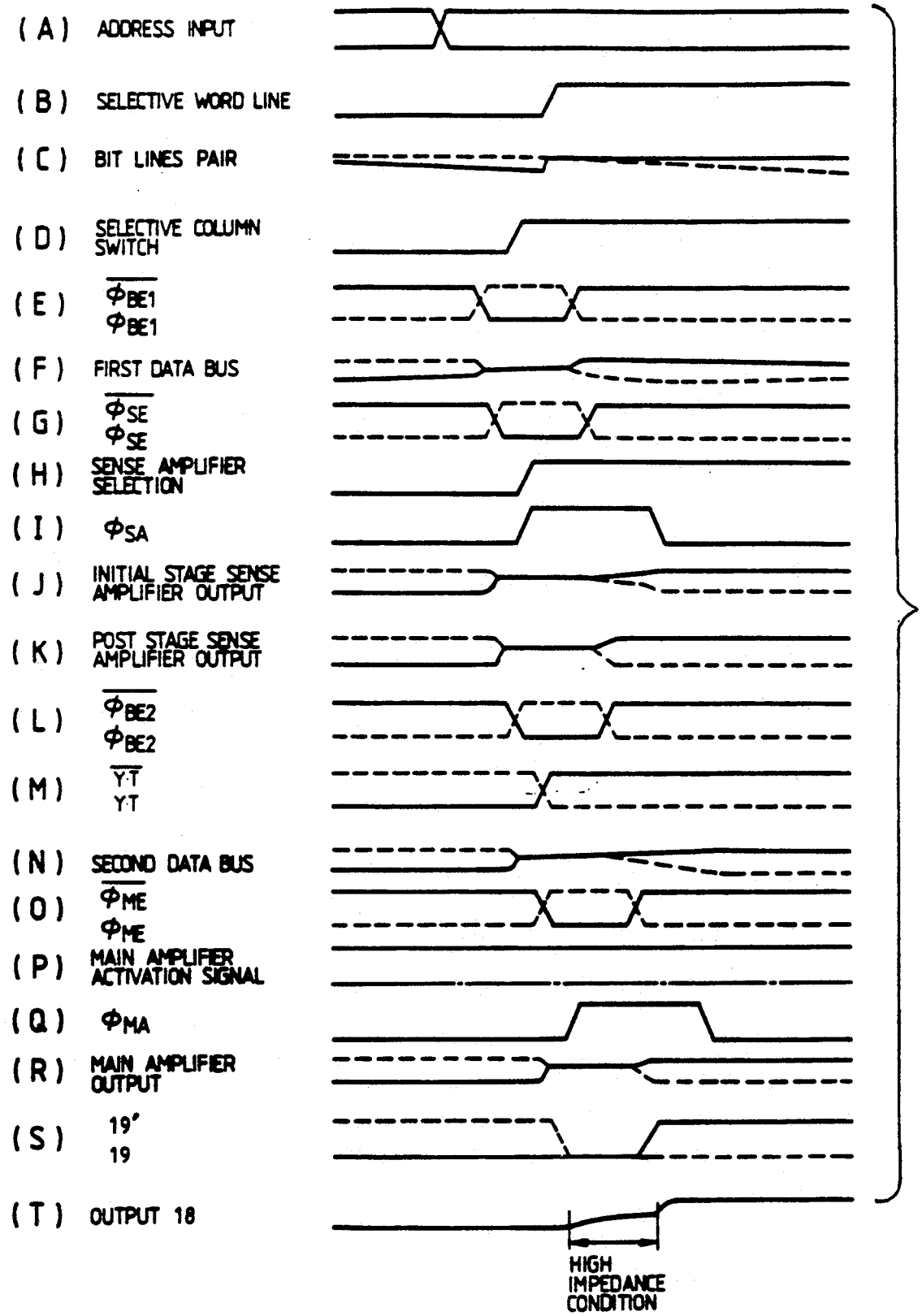
FIGS. 2(A) to 2(T) are waveform charts showing operations of the static type semiconductor memory shown in FIG. 1.
Figure 3:
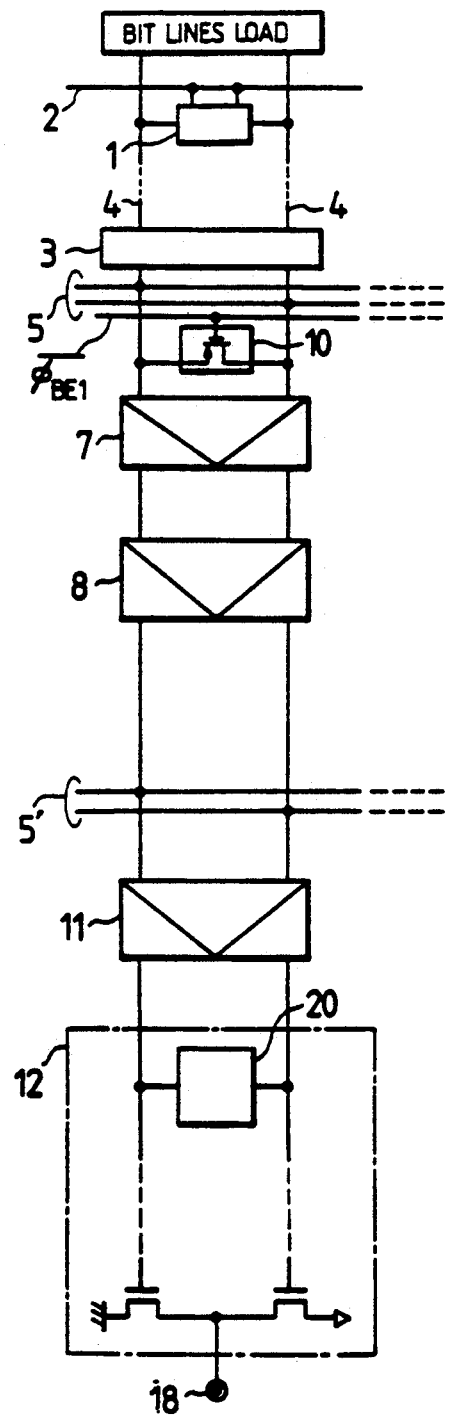
FIG. 3 is a block diagram of a static type semiconductor memory.

FIG. 1 is a block diagram of a static type semiconductor memory according to one embodiment of the present invention. Memory cells that constitute in combination a memory capacity of 1 megabits are divisionally disposed in a plurality of memory arrays 14, 15, 16 and 17. Memory peripheral circuits such as a word line selecting driver circuit and a column selecting driver circuit are disposed between each pair of adjacent memory arrays 14, 15, 16 and 17.

To constitute a static type semiconductor memory, memory cells 1 and 1' are formed using flip-flop type memory cells. When a word line 2 is selected, the memory cell 1 is selected, and complementary signals read out from the memory cell 1 are transmitted to lines 4 and 4', respectively. The "complementary signals" which are described in the present invention are equivalent to differential signals, i.e., two signals which are in such a relation to each other that, when one of them changes to a high level, the other changes to a low level. For example, when the memory cell 1 has the digital value "1" stored therein, a high-level signal is read out to the line 4', while a low-level signal is read out to the line 4. On the other hand, when a word line 2' is selected, the memory cell 1' is selected, and complementary signals read out from the memory cell 1' are transmitted to the lines 4 and 4', respectively. Thus, the lines 4 and 4' function as complementary data line pair.

The complementary signals on the complementary data line pair 4 and 4' are transmitted to first complementary data bus line pair 5 through a column switch 3 which operates as a first switching means. Second complementary data bus line pair 5' which are provided common to the whole of the semiconductor memory chip have a relatively large parasitic capacitance, whereas the first complementary data bus line pair 5 which are provided in one memory array 14 have a relatively small parasitic capacitance. Accordingly, although the signal amplitude of the read-out information complementary signals which are transmitted from the memory cell 1 to the complementary data line pair 4 and 4' is very small, the complementary signals are transmitted to the first complementary data bus line pair 5 at high speed. It should be noted that a bias circuit 6 sets the potential of the first complementary data bus line pair 5 to a predetermined level at the time of a read operation.

Multi-stage connection of an initial stage sense amplifier 7 and a post-stage sense amplifier 8 define first amplifier means. The first amplifier means 7 and 8 execute voltage amplification in response to the complementary signals on the first complementary data bus line pair 5. An equalizing circuit 10 is connected between the complementary inputs of the initial stage sense amplifier 7. The equalizing circuit 10 is constituted by parallel connection of a P-channel MOSFET with the arrow in the figure and an N-channel MOSFET with no arrow. In the following description also, MOSFETs with the arrow are P-channel MOSFETs, while MOSFETs with no arrow are N-channel MOSFETs. Each of the other equalizing circuits 10', 10'' and 10''' is similarly constituted by parallel connection of a P-channel MOSFET and an N-channel MOSFET. The equalizing circuit 10' is connected between the complementary inputs of the post-stage sense amplifier 8, and the equalizing circuit 10'' between the complementary outputs of the post-stage sense amplifier 8. The equalizing circuit 10 operates particularly as a first equalizing means, and first data bus equalizing signals $\phi_{BE1}$ and $\overline{\phi_{BE1}}$ for controlling the equalizing circuit 10 are defined as first control signals.

Complementary output signals of the post-stage sense amplifier 8 are transmitted to the second complementary data bus line pair 5' through a transfer gate type multiplexer 9 which operates as a second switching means. Although the second complementary data bus line pair 5' have a relatively large parasitic capacitance, since the signal amplitude of the complementary outputs of the post-stage sense amplifier 8 is relatively large, the complementary signals are transmitted to the second complementary data bus line pair 5' at high speed.

A main amplifier 11 which operates as a second amplifier means executes voltage amplification in response to the complementary signals on the second complementary data line pair 5'. An equalizing circuit 14 is connected between the complementary inputs of the main amplifier 11. Accordingly, at least either one of the equalizing circuits 10''' and 14 operates as a second equalizing means, and second data bus equalizing signals $\phi_{BE2}$ and $\overline{\phi_{BE2}}$, for example, are defined as second control signals.

An output buffer circuit 12 which operates as a third amplifier means generates an output signal 18 in response to the complementary outputs of the main amplifier 11. Since the complementary outputs of the main amplifier 11 change between a level which is approximate to a power supply voltage and a level which is approximate to a ground voltage, the output buffer circuit 12 executes voltage amplification, but the main amplification function thereof is current amplification. Accordingly, in order to increase the current drive ability at the output terminal 18, the effective device area of N-channel MOSFETs M1 and M2 constituting the push-pull output stage of the output buffer circuit 12 is set so as to be considerably larger than that of the MOSFETs in the memory cells 1 and 1'. An equalizing circuit 15 which operates as a third equalizing means is connected between the complementary inputs of the output buffer circuit 12, and main amplifier output equalizing signals $\phi_{ME}$ and $\overline{\phi_{ME}}$ are defined as third control signals.

The initial stage sense amplifier 7 and the post-stage sense amplifier 8 are controlled by a sense amplifier selection signal and sense amplifier selective boost signals $\phi_{SA}$ which are defined as fourth control signals. The main amplifier 11 is controlled by a main amplifier activation signal and main amplifier selective boost signal $\phi_{MA}$ which are defined as fifth control signals.

It should be noted that the column switch 3 operating as a first switching means is constituted by parallel connection of a P-channel MOSFETS and an N-channel MOSFETS in the same way as in the case of the transfer gate type multiplexer 9 operating as a second switching means. Thus, since the equalizing circuits 10, 10', 10'', 10''', 14, 15, the column switch 3 and the multiplexer 9 are each constituted by a parallel connection of a P-channel MOSFET and an N-channel MOSFET, there is no fear that a level loss of the threshold voltage of the MOSFETs may occur during the signal transmission operation or level difference minimizing operation.

The operation of the static type semiconductor memory shown in FIG. 1 will next be described in more detail with reference to the operation waveform charts shown in FIGS. 2(A) to 2(T).

First, as shown in FIG. 2(A), an address signal input for accessing one memory cell 1 selected from among a plurality of memory cells 1 and 1' is externally supplied to the memory chip. A selective access operation for the memory cells is initiated in response to a change of level of the address signal. During the initial period of this selective access operation, the address signal after the change of level is decoded to execute word line selection based on a row address [see FIG. 2(B)] and column selection based on a column address [see FIGS. 2(D) and 2(M)].

In the initial period of the selective access operation, the sense amplifier selection signal changes from a low level to a high level [see FIG. 2(H)], and this high-level sense amplifier selection signal is supplied to both the initial stage sense amplifier 7 and the post-stage sense amplifier 8, thereby bringing these sense amplifiers 7 and 8 into an activated condition. Similarly, the sense amplifier selective boost signal $\phi_{SA}$ changes from a low level to a high level [see FIG. 2(I)], and this high-level sense amplifier selective boost signal $\phi_{SA}$ is supplied to both the initial stage sense amplifier 7 and the post-stage sense amplifier 8, thus controlling these sense amplifiers 7 and 8 so as to operate in high amplification gain conditions.

Similarly, in the initial period of the selective access operation, the main amplifier activation signal has already been raised to a high level [see FIG. 2(P)], and this high-level main amplifier activation signal is supplied to the main amplifier 11, thereby bringing the main amplifier 11 into an activated condition. On the other hand, the main amplifier selective boost signal $\phi_{MA}$ changes from a low level to a high level [see FIG. 2(Q)], and this high-level main amplifier selective boost signal $\phi_{MA}$ is supplied to the main amplifier 11, thus controlling the main amplifier 11 so as to operate in a high amplification gain condition.

Accordingly, in the initial period of the selective access operation, a complementary signal transmission path which extends from the memory cell 1 to the complementary outputs through the complementary data line pair 4, 4', the column switch 3, the first complementary data bus line pairs 5, the initial stage sense amplifier 7, the post-stage sense amplifier 8, the multiplexer 9 and the second complementary data bus line pairs 5' has already been established. On the other hand, in the initial period of the selective access operation, equalizing signals such as first data bus equalizing signals $\phi_{BE1}$, $\overline{\phi_{BE1}}$, second data bus equalizing signals $\phi_{BE2}$, $\overline{\phi_{BE2}}$ and main amplifier output equalizing output signals $\phi_{ME}$, $\overline{\phi_{ME}}$ have been set to such a value that level difference minimizing operations of the equalizing circuits 10, 10', 10'', 10''', 14 and 15 are executed, as shown in FIGS. 2(E), 2(L) and 2(O). Accordingly, during the execution of the these level difference minimizing operations, the complementary signals which are output from the first complementary data bus line pair 5, the initial stage sense amplifier 7, the post-stage sense amplifier 8, the second complementary data bus line pair 5' and the main amplifier 11 are set to an intermediate level between the high and low levels, as shown in FIGS. 2(F), 2(J), 2(K), 2(N) and 2(R). Since the circuit constant is set such that, when the complementary output signals of the main amplifier 11 are simultaneously at the intermediate level, both the gates 19 and 19' of the output transistors M1 and M2 constituting the output buffer circuit 12 are placed at the ground potential, the output terminal 18 is brought into a high impedance condition. More specifically, since the input threshold of the inverters 121 and 122 of the output buffer circuit 12 is set so as to be lower than the intermediate level between the complementary outputs of the main amplifier 11, both the outputs of the inverters 121 and 122 change to a low level. Therefore, both the outputs of the NAND circuits 123 and 124 are raised to a high level, while both the outputs of the inverters 125 and 126 are changed to a low level, irrespective of the level of the output enable control signal OE. Accordingly, both the output N-channel MOSFETS M1 and M2 turn off to bring the output terminal 18 into a high impedance condition.

In the intermediate period of the selective access operation, equalizing signals such as the first data bus equalizing signals $\phi_{BE1}$, $\overline{\phi_{BE1}}$, the sense amplifier equalizing signals $\phi_{SE}$, $\overline{\phi_{SE}}$, the second data bus equalizing signals $\phi_{BE2}$, $\overline{\phi_{BE2}}$ and the main amplifier output equalizing signals $\phi_{ME}$, $\overline{\phi_{ME}}$ change to such a value that level difference minimizing operations of the equalizing circuits 10, 10', 10'', 10''', 14 and 15 are dissolved, as shown in FIGS. 2(E), 2(G), 2(L) and 2(O). On the other hand, in this intermediate period also, the initial stage sense amplifier 7, the post-stage sense amplifier 8 and the main amplifier 11 are controlled so as to operate in high amplification gain conditions by the sense amplifier selective boost signals $\phi_{SA}$ and the main amplifier selective boost signal $\phi_{MA}$. Accordingly, as a result of the dissolution of the level difference minimizing operations, the complementary signals which are output from the initial stage sense amplifier 7, the post-stage sense amplifier 8, the second complementary data bus lines pair 5' and the main amplifier 11 change at high speed in response to information read out from a selected memory cell, as shown in FIGS. 2(J), 2(K), 2(N) and 2(R). When the output enable control signal OE is at the high level, one of the MOSFETs M1 and M2 of the output buffer circuit 12 turns on, while the other turns off, in response to the complementary output signals from the main amplifier 11, and a high- or low-level output signal is obtained at the output terminal 18.

In the final period of the selective access operation, the sense amplifier selective boost signal $\phi_{SA}$ and the main amplifier selective boost signal $\phi_{MA}$ change from the high level to the low level, as shown in FIGS. 2(I) and 2(Q). On the other hand, in this final period also, the sense amplifier selective signal and the main amplifier activation signal are held at the high level, as shown in FIGS. 2(H) and 2(P). Accordingly, the initial stage sense amplifier 7, the post-stage sense amplifier 8 and the main amplifier 11 operate in low amplification gain conditions and, at the same time, in low power consumption conditions, and hence the complementary signals which are output from the initial stage sense amplifier 7, the post-stage sense amplifier 8, the second complementary data bus lines pair 5' and the main amplifier 11 hold the respective levels in the above-described intermediate period, as shown in FIGS. 2(J), 2(K), 2(N) and 2(R). Therefore, when the enable control signal OE is at the high level, the level determined in the intermediate period is held at the output terminal 18 of the output buffer circuit 12. The output buffer circuit 12 is a tri-state type circuit; therefore, when the output enable control signal OE is at a low level, the outputs of the inverters 125 and 126 are always at the low level, and the output terminal 18 is brought into a high impedance condition.

The internal circuits of the static type semiconductor memory shown in FIG. 1 will next be described in detail.

Figure 4:
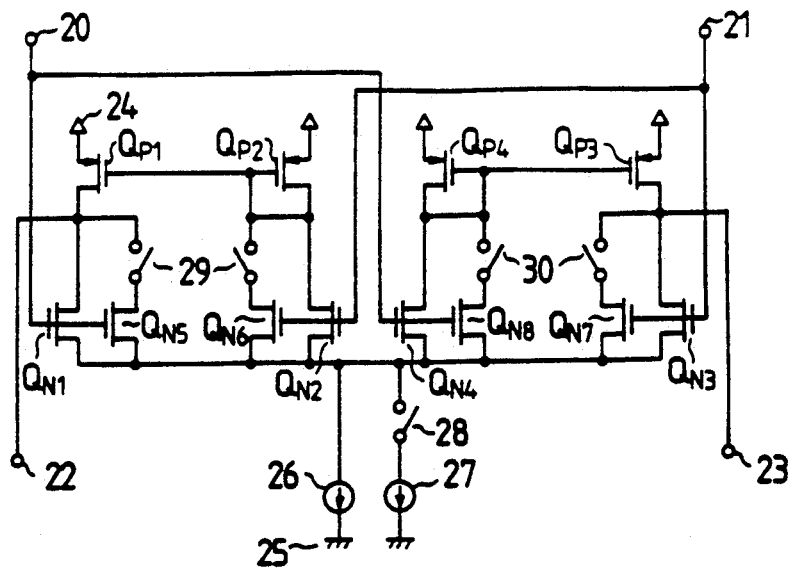
FIGS. 4 to 6 are circuit diagrams respectively showing amplifier circuits which may be utilized as the sense amplifier or main amplifier in the embodiment shown in FIG. 1.

FIG. 4 is a circuit diagram showing an amplifier circuit which may be utilized as the sense amplifier 7, 8 or the main amplifier 11 shown in FIG. 1. This amplifier circuit is connected between a power supply 24 and a ground potential point 25 and has complementary input terminals 20, 21 and complementary output terminals 22, 23. N-channel MOSFETs $Q_{N1}$ to $Q_{N8}$ are driver transistors which respond at their gates to complementary input signals and which are connected at their sources to current sources 26 and 27 to obtain output signals at their drains. P-channel MOSFETs $Q_{P1}$ to $Q_{P4}$ are current mirror-type load transistors. The current source 26 supplies a predetermined constant current in response to the sense amplifier selective signal or the main amplifier activation signal, while a combination of a switch 28 and the current source 27 supplies a relatively large constant current to the N-channel MOSFETs $Q_{N1}$ to $Q_{N8}$ in response to the sense amplifier selective boost signal or the main amplifier selective boost signal. Since switches 29 and 30 are also turned on in response to the sense amplifier selective boost signal or the main amplifier selective boost signal, when these switches are turned on, the N-channel MOSFETs $Q_{N1}$ to $Q_{N8}$ contribute to the amplifying operation of the amplifier circuit. In the other case, the switches 29 and 30 are off; therefore, the N-channel MOSFETs $Q_{N5}$ to $Q_{N8}$ do not contribute to the amplifying operation. Accordingly, when the switches 28, 29 and 30 are on, this amplifier circuit operates in a high amplification gain condition, whereas, when the switches 28, 29 and 30 are off, it operates in a low amplification gain condition and, at the same time, in a low power consumption condition.

Figure 5:
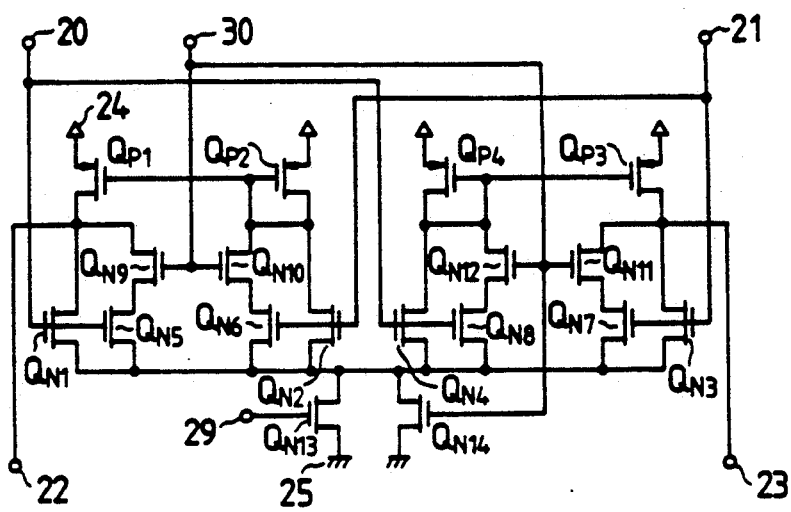

FIG. 5 shows a modification obtained by modifying the amplifier circuit shown in FIG. 4. More specifically, the current source 26 in the arrangement shown in FIG. 4 is replaced by an N-channel MOSFET $Q_{N13}$, the combination of the switch 28 and the current source 27 by an N-channel MOSFET $Q_{N14}$, and the switches 29 and 30 by N-channel MOSFETs $Q_{N9}$ to $Q_{N12}$. Accordingly, in the amplifier circuit shown in FIG. 5, the control input terminal 29 is supplied with either the sense amplifier selective signal or the main amplifier selective signal, while the control input terminal 30 is supplied with either the sense amplifier selective boost signal or the main amplifier selective boost signal.

Figure 6:
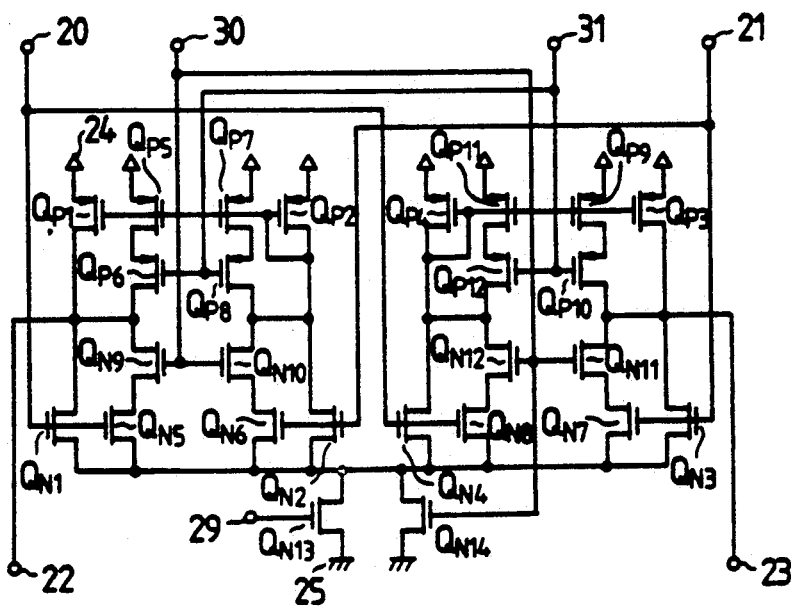

FIG. 6 shows a modification obtained by further modifying the amplifier circuit shown in FIG. 5. The arrangement shown in FIG. 6 differs from the modification shown in FIG. 5 in that a current path is formed through the P-channel MOSFETs $Q_{P5}$ to $Q_{P12}$ in response to a selective boost signal supplied to the terminal 31 to thereby further control the gain and the output level.

It should be noted that, although in each of the modifications shown in FIGS. 4, 5 and 6 a circuit including P-channel MOSFETs as load transistors and N-channel MOSFETs as driver transistors is employed, it is, of course, possible to realize a similar amplifier circuit with a circuit configuration which is inverse to the above, that is, in which P-channel MOSFETs are employed as driver transistors and N-channel MOSFETs as load transistors.

Figure 7:
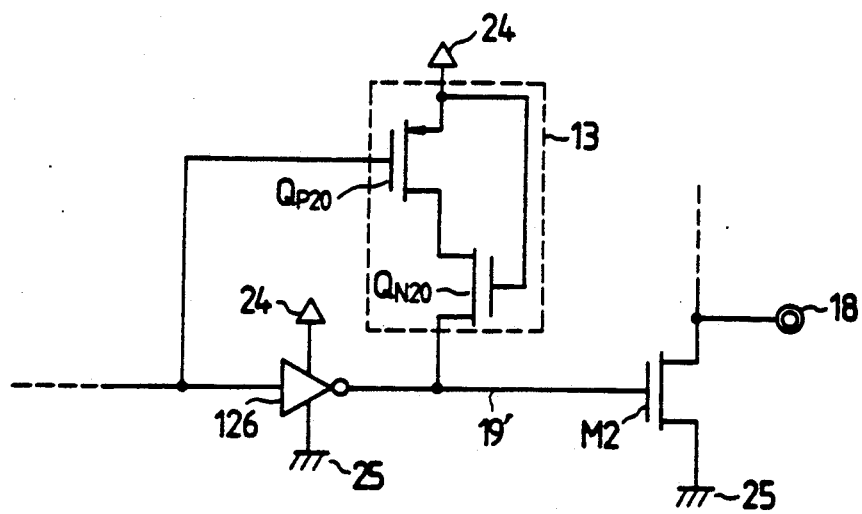
FIG. 7 is a circuit diagram showing in detail a part of the output buffer circuit in the embodiment shown in FIG. 1.

FIG. 7 is a circuit diagram showing in detail a part of the output buffer circuit 12 shown in FIG. 1. The feature of the circuit shown in FIG. 7 resides in that the signal transmission path between the input and output of a wave change control circuit 13 is connected in parallel to the signal transmission path between the input and output of the CMOS inverter 126. The wave change control circuit 13 comprises a P-channel MOSFET $Q_{P20}$ and an N-channel MOSFET $Q_{N20}$. The gate, source and drain of the MOSFET $Q_{P20}$ are respectively connected to the input of the CMOS inverter 126, a positive power supply 24 and the drain of the MOSFET $Q_{N20}$. The gate and source of the MOSFET $Q_{N20}$ are respectively connected to the positive power supply 24 and the output of the CMOS inverter 126. The gate of the output N-channel MOSFET M2 is driven by the respective outputs of the CMOS inverter 126 and the wave change control circuit 13.

Figure 8:
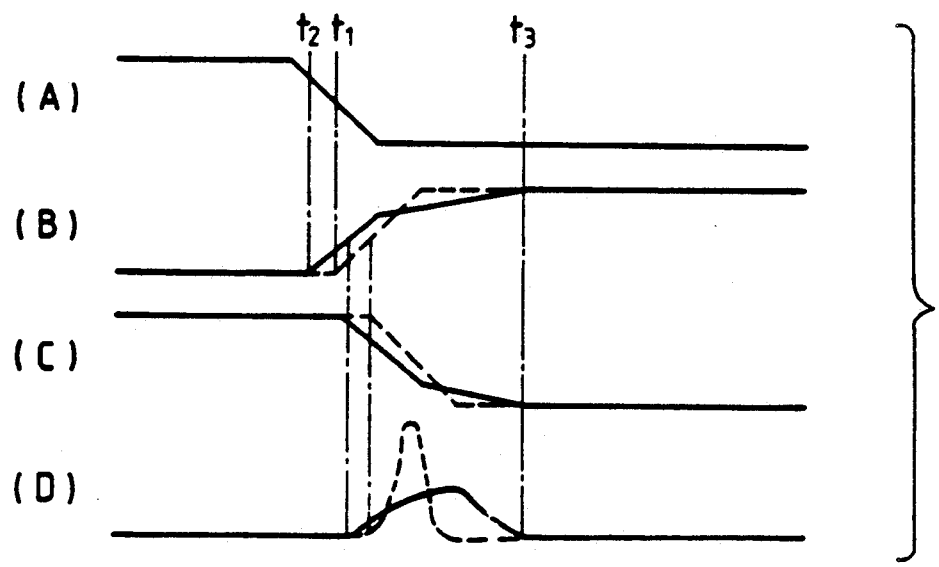
FIGS. 8(A) to 8(D) are waveform charts showing the operations of various portions of the circuit shown in FIG. 7.

FIG. 8 is a waveform chart showing the operations of various portions of the circuit shown in FIG. 7. The dotted lines in FIG. 8 show the waveforms in the case where the wave change control circuit 13 is omitted, while the solid lines show the waveforms obtained when the wave change control circuit 13 is connected as shown in FIG. 7.

The arrangement wherein the wave change control circuit 13 is omitted will first be explained. When the input signal to the CMOS inverter 126 changes from a high level to a low level, as shown in FIG. 8(A), the output signal from the CMOS inverter 126 changes from a low level to a high level at high speed, as shown in FIG. 8(B) after the time $t_1$ at which the input signal becomes lower than the input threshold of the CMOS inverter 126. In response to this, the drain voltage of the output N-channel MOSFET M2 changes from a high level to a low level, as shown in FIG. 8(C). In general, a parasitic load capacitance of several tens to 100 pF is equivalently connected to the output terminal 18 of the output buffer circuit 12 in the static type semiconductor memory, and this parasitic load capacitance is charged to a level equal to the voltage of the positive power supply 24, i.e., about 5 V, through the output N-channel MOSFET M1 of the output buffer circuit 12. On the other hand, the effective device area of the N-channel MOSFETs M1 and M2 of the output buffer circuit 12 is set at a considerably large value in order to enhance the drive of current at the output terminal 18. When the output signal from the CMOS inverter 126 changes from the low level to the high level at high speed, as shown by the chain line in FIG. 8(B), a transient current having an excessive peak value flows through the N-channel MOSFET M2 while the parasitic load capacitance is being discharged to the ground potential points as shown in FIG. 8(D). If the transient current having an excessive peak value flows to the ground line, a transient noise is induced in the ground line, which brings about a mal-operation of other circuits. In such a case, it takes a great deal of time to restore the system to the normal condition.

In order to avoid this problem, the wave change control circuit 13 is disposed in the output buffer circuit 12. Accordingly, if the input signal to the CMOS inverter 126 lowers from the voltage level of the power supply 24 to a level which is lower than the threshold voltage of the P-channel MOSFET $Q_{P20}$ before the time $t_1$, the MOSFETs $Q_{P20}$ and $Q_{N20}$ start to conduct at the time $t_2$, thus causing the output signal from the CMOS inverter 126 to rise as shown in FIG. 8(B). When the rising output signal of the CMOS inverter 126 reaches a voltage which is lower than the power supply voltage by an amount corresponding to the threshold voltage of the N-channel MOSFET $Q_{N20}$, the N-channel MOSFET $Q_{N20}$ is cut off; therefore, the rise of the output signal of the CMOS inverter 126 is determined by the inverter operation of the CMOS inverter 126 itself.

The addition of the wave change control circuit 13 to the CMOS inverter 126 enables the output signal from the CMOS inverter 126 to change from the low level to the high level over an increased period of time, i.e., from the time $t_2$ to the time $t_3$. Accordingly, the peak value of the transient current flowing through the N-channel MOSFET M2 can be lowered as shown by the solid line in FIG. 8(D).

The foregoing embodiment enables realization of a 4-bit parallel output type 1-megabit static type semiconductor memory in a CMOS process of 0.8 micron rule, which memory is capable of performing a high speed operation, i.e., a typical access time of 15 nanoseconds, and has a low power consumption, i.e., an operating power consumption of 250 milliwatt (at 20 MHz).

According to the present invention, equalization is executed to minimize the level difference of complementary inputs of each of the first, second and third amplifier means, and therefore, even if there is some offset or imbalance between the complementary bit lines pair, the first switching means, the first complementary data bus lines pair, the first amplifier means, the second switching means, the second complementary data bus lines pair and the second amplifier means, the inverse information read operation can be executed at high speed by setting an intermediate level by the equalization.

Further, since information read out from one selected memory cell is amplified by the first and second amplifier means controlled to operate in high amplification gain conditions, it is possible to perform high-speed sense amplification. Thereafter, the first and second amplifier means are controlled to operate in such low amplification gain conditions that the read-out information output obtained by the high speed sense amplification is held without a fear of disappearing. Accordingly, it is possible to realize a low power consumption.

What is claimed is:

1. A static type semiconductor memory comprising:
   (1) a plurality of memory arrays each of which includes a plurality of memory cells, a plurality of complementary data line pairs, a first complementary data bus line pair, a first switch connected between said plurality of complementary data line pairs and said first complementary data bus line pair, and a first amplifier responding to complementary signals on said first complementary data line pairs being connected to a selected group of said plurality of memory cells;
   (2) a second complementary data bus line pair;
   (3) a second switch connected between complementary outputs of said first amplifier and said second complementary data bus line pair;
   (4) a second amplifier responding to complementary signals on said complementary data bus line pair; and (5) a third amplifier generating an output signal in response to complementary outputs of said second amplifier means;

wherein an operation of said first amplifier is controlled by a first control signal;

wherein an operation of said second amplifier is controlled by a second control signal;

wherein an address signal for accessing a selective one from among said plurality of memory cells is supplied to said static type semiconductor memory, and wherein levels of said first and second control signals are set to such values that said first and second amplifiers operate in high amplification gain conditions in response to a change of level of said address signal, and thereafter levels of said first and second control signals are set to such values that said first and second amplifiers operate in a low power consumption conditions.

2. A static type semiconductor memory according to claim 1, further comprising:

an equalizer minimizing a level difference of complementary inputs of at least one of said first, second and third amplifiers in response to a third control signal;

wherein a level of said third control signal is of a value that a level difference minimizing operation of said equalizer is executed in response to the change of level of said address signal, and thereafter said level of said third control signal is of a value that said level difference minimizing operation of said equalizer means is in effective.

3. A static type semiconductor memory according to claim 2, wherein levels of said first and second control signals are set such that, when said first and second amplifiers operate in the low power consumption conditions, information read out through said first and second amplifiers operating in the high amplification gain conditions is held.

4. A static type semiconductor memory according to claim 3, wherein, after said level difference minimizing operation of said equalizers is ineffective the operating conditions of said first and second amplifiers are switched from said high amplification gain conditions to said low power consumption conditions.

* * * * *

UNITED STATES PATENT AND TRADEMARK OFFICE
CERTIFICATE OF CORRECTION

PATENT NO. : 5,088,065                    Page 1 of 3
DATED      : Feb. 11, 1992
INVENTOR(S): Shoji Hanamura et al It is certified that error appears in the above-indentified patent and that said Letters Patent is hereby corrected as shown below:

| Column | Line | |
|---|---|---|
| 1 | 37 | Change "sense amplifier 8" to --sense amplifier 7--. |
| 1 | 38 | Change "sense amplifier 7" to --sense amplifier 8--. |
| 1 | 39 | Change "postage" to --post-stage--. |
| 2 | 1-5 | Center heading above text; begin a new paragraph, with proper margin alignment. |
| 2 | 9 | After "arrays" insert --,--. |
| 3 | 47 | Change "data bus lines pair" to --data bus line pair--. |
| 3 | 49 | Change "data bus lines pair" to --data bus line pair--. |
| 3 | 51 | Change "data bus lines pair" to --data bus line pair--. |
| 4 | 38 | Before "complementary" insert --a--. |
| 5 | 11 | Change "signals $\phi_{BE1}$ and $\phi_{BE1}$" to --$\phi_{BE1}$ and $\overline{\phi_{BE1}}$--. |

UNITED STATES PATENT AND TRADEMARK OFFICE
CERTIFICATE OF CORRECTION

PATENT NO. : 5,088,065
DATED : Feb. 11, 1992
INVENTOR(S) : Shiji Hanamura et al

It is certified that error appears in the above-indentified patent and that said Letters Patent is hereby corrected as shown below:

| Column | Line | |
|---|---|---|
| 5 | 33 | Change "$\phi_{BE2}$ and $\phi_{BE2}$" to --$\phi_{BE2}$ and $\overline{\phi_{BE2}}$--. |
| 5 | 53 | Change "$\phi_{ME}$ and $\phi_{ME}$" to --$\phi_{ME}$ and $\overline{\phi_{ME}}$--. |
| 5 | 58 | change "nals" to --nal--. |
| 5 | 64 | Change "MOSFETS" to --MOSFETs--. |
| 5 | 65 | Change "MOSFETS" to --MOSFETs--. |
| 6 | 58 | Change "$\phi_{BE1}$," to --$\overline{\phi_{BE1}}$,--; change "$\phi_{BE2}$, $\phi_{BE2}$" to --$\phi_{BE2}$, $\overline{\phi_{BE2}}$--. |
| 6 | 59 | After "equalizing" delete "output". |
| 6 | 60 | Change "$\phi_{ME}$" to --$\overline{\phi_{ME}}$--. |
| 6 | 64 | Before "these" delete "the". |
| 7 | 20 | Change "MOSFETS" to --MOSFETs--. |
| 7 | 24 | Change "$\phi_{BE1}$, $\phi_{BE1}$" to --$\phi_{BE1}$, $\overline{\phi_{BE1}}$--. |
| 7 | 25 | Change "$\phi_{SE}$, $\phi_{SE}$" to --$\phi_{SE}$, $\overline{\phi_{SE}}$--. |
| 7 | 26 | Change "$\phi_{BE2}$, $\phi_{BE2}$" to --$\phi_{BE2}$, $\overline{\phi_{BE2}}$--. |
| 7 | 27 | Change "$\phi_{ME}$, $\phi_{ME}$" to --$\phi_{ME}$, $\overline{\phi_{ME}}$--. |
| 7 | 35 | Change "signals" to --signal--. |

UNITED STATES PATENT AND TRADEMARK OFFICE
CERTIFICATE OF CORRECTION

PATENT NO. : 5,088,065
DATED : Feb. 11, 1992
INVENTOR(S) : Shoji Hanamura et al

It is certified that error appears in the above-indentified patent and that said Letters Patent is hereby corrected as shown below:

| Column | Line | |
|--------|------|---|
| 10 | 52 | After "arrays" insert --,--. |
| 11 | 19 | Change "conditions" to --condition--. |
| 12 | 9 | Change "in effective" to --ineffective--. |
| 12 | 19 | After "ineffective" insert --,--. |

Signed and Sealed this

Tenth Day of May, 1994

Attest:

BRUCE LEHMAN

Attesting Officer     Commissioner of Patents and Trademarks